US007088178B1

(12) United States Patent
Rosenfeld et al.

(10) Patent No.: US 7,088,178 B1
(45) Date of Patent: Aug. 8, 2006

(54) HIGH-GAIN, BULK-DRIVEN OPERATIONAL AMPLIFIERS FOR SYSTEM-ON-CHIP APPLICATIONS

(75) Inventors: Jonathan Rosenfeld, Rochester, NY (US); Mucahit Kozak, Tonawanda, NY (US); Eby G. Friedman, Rochester, NY (US)

(73) Assignee: University of Rochester, Rochester, NY (US)

( * ) Notice: Subject to any disclaimer, the term of this patent is extended or adjusted under 35 U.S.C. 154(b) by 63 days.

(21) Appl. No.: 10/870,684

(22) Filed: Jun. 18, 2004

Related U.S. Application Data

(60) Provisional application No. 60/479,506, filed on Jun. 19, 2003.

(51) Int. Cl.
*H03F 3/45* (2006.01)
(52) U.S. Cl. ...................... 330/253; 330/255
(58) Field of Classification Search ............... 330/253, 330/255, 262, 269
See application file for complete search history.

(56) References Cited

U.S. PATENT DOCUMENTS 6,118,341 A * 9/2000 Huijsing et al. ............ 330/253
6,366,167 B1 * 4/2002 Stockstad ................... 330/253

OTHER PUBLICATIONS

Veeravalli et al., "Transconductance Amplifier Structures with Very Small Transconductances: A Comparative Design Approach", (IEE Journal of Solid-State Circuits, vol. 37, No. 6, Jun. 2002).*
"A rail-to-Rail, Constant-$G_m$, 1-Volt CMOS Opamp", F. Bahmani, et al., IEEE International Symposium on Circuits and Systems, May 28-31, 2000, Switzerland, pp. II-669-II-672.
"Low Voltage Analog Circuit Design Techniques: A Tutorial", S. Yan, et al., IEICE Trans. Analogo Intergrated Circuits and Systems, vol. E00-A, No. 2, Feb. 2000, pp. 1-17.
"A 0.8 Volt High Performance OTA Using Bulk-Driven MOSFETs for Low Power Mixed-Signal SOCs", J. Rosenfeld, et al., University of Rochester, Rochester, New York, pp. 245 and 246.

* cited by examiner

*Primary Examiner*—Khanh Van Nguyen
(74) *Attorney, Agent, or Firm*—Blank Rome LLP

(57) ABSTRACT

An ultra-low voltage rail-to-rail operational transconductance amplifier (OTA) is based on a standard digital 0.18 μm CMOS process. Techniques for designing a 0.8 volt fully differential OTA include bias and reference current generator circuits. To achieve rail-to-rail operation, complementary input differential pairs are used, where the bulk-driven technique is applied to reduce the threshold limitation of the MOSFET transistors. The OTA gain is increased by using auxiliary gain boosting amplifiers.

16 Claims, 4 Drawing Sheets

HIGH-GAIN, BULK-DRIVEN OPERATIONAL AMPLIFIERS FOR SYSTEM-ON-CHIP APPLICATIONS

REFERENCE TO RELATED APPLICATION

The present application claims the benefit of U.S. Provisional Patent Application No. 60/479,506, filed Jun. 19, 2003, whose disclosure is hereby incorporated by reference in its entirety into the present disclosure.

STATEMENT OF GOVERNMENT INTEREST

The work leading to the present invention was supported in party by the DARPA/ITO under AFRL Contract F29601-00-K-0182, the National Science Foundation under Contract No. CCR-0304574, and the Fulbright Program under Grant No. 87481764. The government has certain rights in the invention.

FIELD OF THE INVENTION

The present invention is directed to a bulk-driven operational amplifier and more particularly to such an amplifier exhibiting high gain, suitable for use in system-on-chip applications requiring low power.

DESCRIPTION OF RELATED ART

The reduction in the minimum dimensions in VLSI technologies, along with the trend of using small portable devices, necessitates reduced power supply voltages. In order to facilitate submicrometer high density systems on a single integrated circuit (IC), voltage levels must be lowered to ensure reliability. Threshold voltages of future CMOS technologies may not decrease much below what is available today, making it difficult to design analog circuits with lower supply voltages.

In analog circuit design, the threshold voltage of a transistor should be lowered in proportion to the reduction in the supply voltage to appropriately bias the device. This characteristic makes standard low voltage analog circuits incompatible with CMOS technology trends. To combat this conflict without requiring the development of expensive CMOS technologies with lower threshold voltages, novel circuit design techniques must be developed that are compatible with future CMOS technologies.

A promising approach in low voltage analog circuits is the so-called "bulk-driven" MOSFET method. In this method, the gate-to-source voltage is set to a value sufficient to form an inversion layer, and an input signal is applied to the bulk terminal. In this manner, the threshold voltage of a MOSFET can be reduced or even removed from the signal path.

The concept of a bulk-driven MOS transistor was first proposed in A. Guzinski, M. Bialko, and J. C. Matheau, "Body-Driven Differential Amplifier for Application in Countinous-Time Active-C Filter," *Proceedings of the European Conference on Circuit Theory and Design*, pp. 315–319, June 1987, as active components in an OTA differential input stage. Later, in 1991, the concept was used in the practical realization of a software-programmable CMOS telephone circuit, as reported in F. Dielacher, J. Houptmann, and J. Resinger, "A Software Programmable CMOS Telephone Circuit," *IEEE Journal of Solid-State Circuits*, Vol. 26, No. 7, pp. 1015–1026, July 1991. However, not until 1998 did the method draw significant attention as a viable low-voltage analog design technique, as reported in B. J. Blalock, P. E. Allen, and G. A. Rincon-Mora, "Design 1-V Op Amps Using Standard Digital CMOS Technology," *IEEE Transactions on Circuits and Systems II. Analog and Digital Signal Processing*, Vol. 45, No. 7, pp. 769–780, July 1998. Specifically, in Blalock et al, a 1 volt Op Amp was designed in a standard CMOS digital process utilizing the depletion characteristics of bulk-driven transistors.

One important drawback of the bulk-driven method, however, is that the body transconductance $g_{mb}$ is approximately five times smaller than the gate transconductance $g_m$. Thus, when the input differential pair of an amplifier is composed of bulk-driven transistors, the resulting DC gain is relatively low. This behavior is the primary reason for the low gain (around 45 dB) in previously reported bulk-driven amplifiers, as reported in Blalock et al and in F. Bahmani and S. M. Fakhraie, "A Rail-to-Rail, Constant-$G_m$, 1-Volt CMOS Opamp," *Proceedings of the IEEE International Symposium on Circuits and Systems*, Vol. 2, pp. 669–672, May 2000.

SUMMARY OF THE INVENTION

It is thus an object of the present invention to improve the gain of bulk-driven amplifiers. To achieve the above and other objects, the present invention is directed to an ultra-low voltage rail-to-rail operational transconductance amplifier (OTA) which can be based on a standard digital 0.18 μm CMOS process. To achieve rail-to-rail opera-tion, complementary input differential pairs are used, where the bulk-driven technique is applied to reduce the threshold limitation of the MOSFET transistors. The OTA gain is increased by using auxiliary gain boosting amplifiers. This additional circuitry enables the OTA to operate at 0.8 volts, achieving an open loop gain of 68 dB while consuming 94 μW. The DC gain of the amplifier is the highest gain achieved to date in bulk-driven amplifiers.

In a preferred embodiment, a 0.8 volt fully differential folded-cascode OTA is presented. Both PMOS and NMOS bulk-driven input differential pairs are used to achieve full rail-to-rail operation. A continuous-time common mode feedback circuit is adopted in order to suppress variations in the output common mode. Four common-source gain boosting amplifiers are used to increase the gain to the target level of 68 dB (the DC gain was around 48 dB before gain boosting). That gain is the highest gain achieved to date in bulk-driven amplifiers. A bias circuitry which generates the required bias voltages for the amplifier core along with a low-sensitivity reference current generator circuit are also used in the preferred embodiment.

The design of an ultra-low voltage, high performance folded-cascode OTA circuit in a standard digital CMOS process will be disclosed. To accommodate a low power supply voltage (0.8 volt), the bulk-driven MOSFET approach is used. The low gain disadvantage of the bulk-driven technique is circumvented by employing gain boosting amplifiers, permitting the achievement of a DC gain of 68 dB. Due to a lower body transconductance, bulk-driven amplifiers inherently exhibit relatively poor gain. The low gain is the primary reason why amplifiers reported in Blalock et al and in Bahmani et al have only exhibited a DC gain as high as 45 dB. The present invention offers an advantage in that that bulk-driven amplifiers can be modified to operate with low power supply voltages while still exhibiting performance levels that satisfy the demands of state-of-the-art mixed-signal circuits.

Aspects of the present invention are disclosed in the following paper, which is hereby incorporated by reference in its entirety into the present disclosure: Jonathan Rosenfeld, Mucahit Kozak and E. G. Friedman, "A 0.8 volt high performance OTA using bulk-driven MOSFETs for low power mixed signal SOCs," *Proceedings of the IEEE International SOC Conference*, September 2003, pp. 245–246.

BRIEF DESCRIPTION OF THE DRAWINGS

A preferred embodiment of the present invention will be set forth in detail with reference to the drawings, in which.

DETAILED DESCRIPTION OF THE PREFERRED EMBODIMENT

Figure 1:
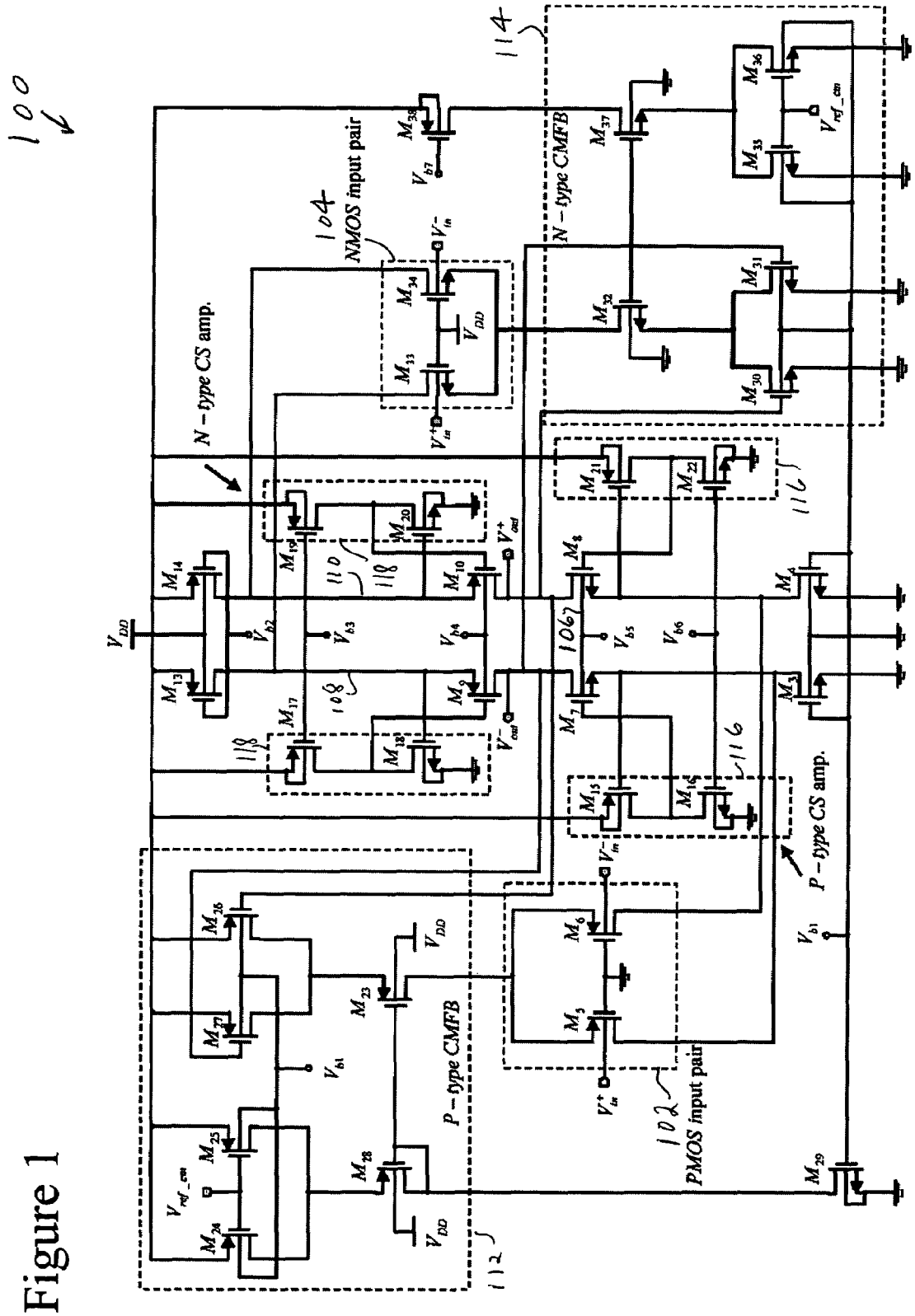
FIG. 1 is a circuit diagram showing an amplifier core of an OTA according to the preferred embodiment.

A preferred embodiment of the present invention will be set forth in detail with reference to the drawings, in which like reference numerals refer to like elements throughout.

The amplifier core 100 of an OTA is illustrated in FIG. 1. This circuit is based on a fully differential topology with two complementary input pairs 102, 104. The output branch 106 includes common gate amplifiers $M_7$, $M_8$ with cascode current loads 108, 110 to increase the gain. A common mode feedback circuit (CMFB) 112, 114 is used with four auxiliary common source amplifiers. The operation of the OTA is explained in greater detail below.

Rail-to-rail operation is achieved using a pair of PMOS (102; $M_5$ and $M_6$) and NMOS (104; $M_{33}$ and $M_{34}$) transistors at the input stage. This strategy supports rail-to-rail (0 volt to 0.8 volt) operation of the amplifier; thus, the input common mode range (ICMR) is extended to the largest possible range. This increased range is achieved because when the input common mode voltage is low, the P-type pair is on and the N-type pair is off, while when the input common mode is high, the P-type pair is off and the N-type pair is on. In the middle range, however, both pairs are on, providing a higher overall gain.

The output branch 106 of the OTA includes two symmetric common gate (CG) amplifiers ($M_7$ and $M_8$). Both amplifiers have cascode current loads (108, including $M_9$ and $M_{13}$; and 110, including $M_{10}$ and $M_{14}$) to increase the gain. The bias current is provided to $M_7$ and $M_8$ by the current sources $M_3$ and $M_4$, respectively, which also operate as current loads for the P-type input pair ($M_5$ and $M_6$). Note that a complementary structure is also implemented for the N-type input pair. Transistors $M_{13}$ and $M_{14}$ act as current sources for the N-type input pair.

Auxiliary common source (CS) amplifiers (116, including $M_{15}$, $M_{16}$, $M_{21}$, and $M_{22}$; and 118, including $M_{17}$, $M_{18}$, $M_{19}$, and $M_{20}$ shown in FIG. 1) provide a target open loop gain of at least 60 dB. In this way, stacking multiple transistors in the output branch is avoided, providing more overdrive voltage to maintain the transistors in the saturation region, while simultaneously increasing the voltage gain. The output of the CS amplifier is connected to the gate of the CG amplifier so as to maintain an almost constant source voltage. This source node is fed back as the input voltage to the CS amplifier. In this way, the local feedback action reduces the variations in the bias current when the source voltage of the CG amplifier changes, thereby increasing the output resistance.

The CMFB circuit (112, including $M_{24}$, $M_{25}$, $M_{26}$, and $M_{27}$; and 114, including $M_{30}$, $M_{31}$, $M_{35}$, and $M_{36}$ shown in FIG. 1) is used to suppress the variations in the output common mode, particularly in applications with feedback. These variations occur due to mismatches among the transistors. These mismatches cause a difference between the DC operating voltages in the outputs ($V_{out}^+$ and $V_{out}^-$). Furthermore, by forcing the output common mode to a specific level (normally halfway between $V_{DD}$ and ground), the range of the input common mode is increased.

The CMFB circuit was first proposed in B. Razavi, *Design of Analog CMOS Integrated Circuits*, New York: McGraw-Hill, 2001. In this configuration, transistors $M_{24}$, $M_{25}$, $M_{26}$, and $M_{27}$ operate in the linear region, acting as voltage controlled resistors. When the DC operating point at the output differs from the target common mode voltage, a change in the tail current of the input pair occurs, resulting in an increment or decrement in the bias currents. This effect restores the DC operating point to the desired voltage level.

Figure 2:
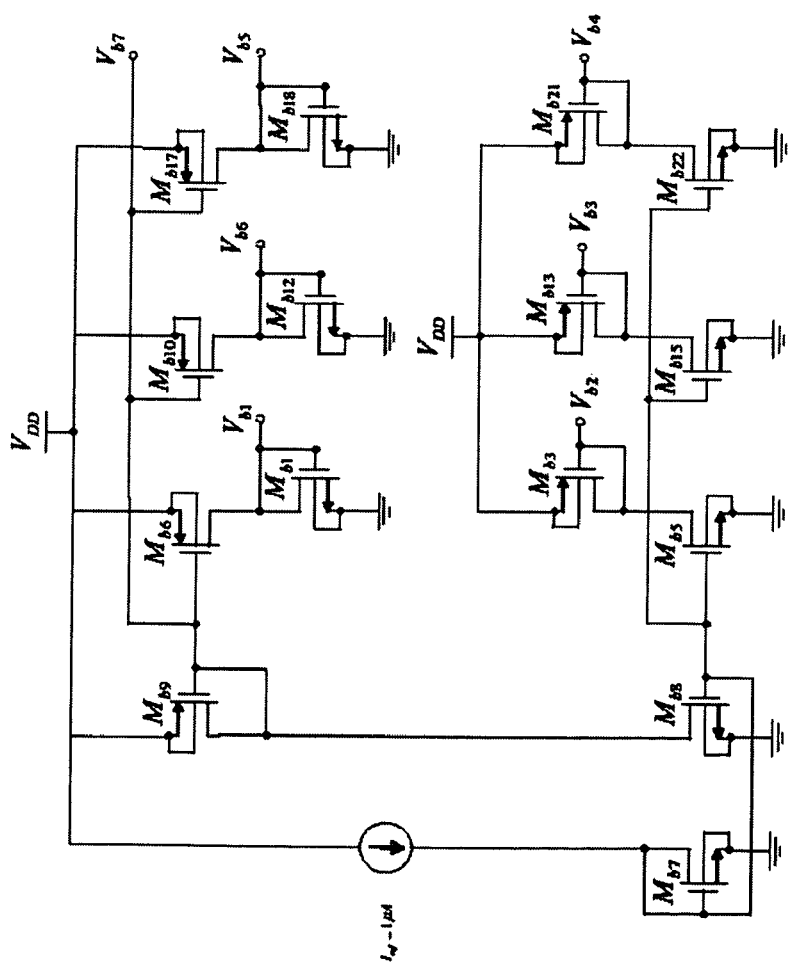
FIG. 2 is a circuit diagram showing a bias voltage generator circuit for use with the amplifier core of FIG. 1.

In order to ensure that the transistors operate in the saturation region (or in the linear region for some of the transistors in the CMFB circuit), fixed bias voltages are applied either to the gate or body of the transistors. The bias voltage generator circuit 200 is shown in FIG. 2.

Due to limited voltage headroom, simple voltage dividers are used to generate the bias voltages ($V_{b1}$ through $V_{b7}$ in FIG. 1). Transistors $M_{b6}$, $M_{b10}$, and $M_{b17}$ act as current mirrors for the transistor $M_{b9}$, providing the appropriate currents to generate voltages $V_{b1}$, $V_{b5}$, and $V_{b6}$. A complementary structure is also applied to generate voltages $V_{b2}$, $V_{b3}$, and $V_{b4}$. Transistor $M_{b8}$ is the current mirror of $M_{b7}$, which is biased with a constant current source $I_{ref}$ (1 μA).

Figure 3:
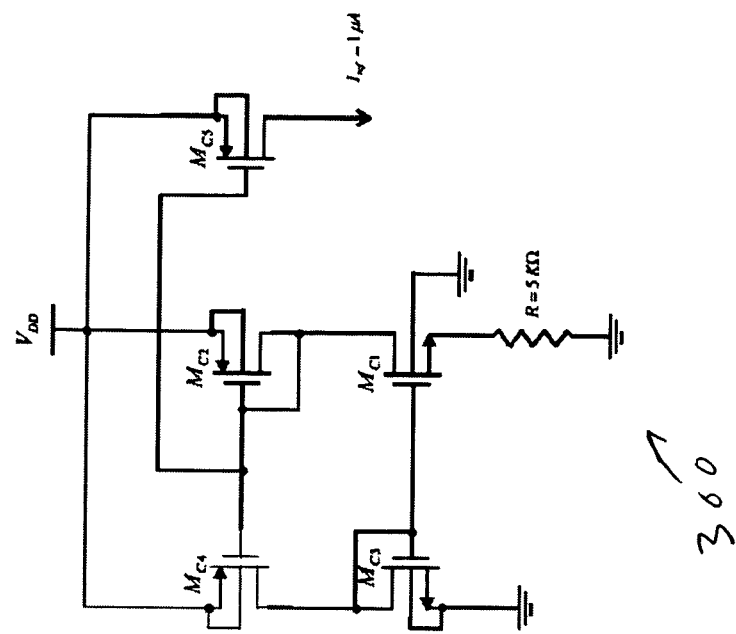
FIG. 3 is a circuit diagram showing a low sensitivity reference current generator for use with the amplifier core of FIG. 1.

A low-sensitivity reference current generator circuit 300 is illustrated in FIG. 3. Because the gate and source of $M_{c4}$ and $M_{c2}$ are common for both transistors, and the aspect ratios are equal, $I_{Dc4}=I_{Dc2}$ (neglecting channel length modulation). Furthermore, note that $V_{GSc3}=V_{GSc1}+I_{Dc1}R_{Sc1}$. Thus, $$\sqrt{\frac{2 \cdot I_{Dc2}}{\mu_n \cdot C_{ox} \cdot (W/L)_{Mc3}}} = \sqrt{\frac{2 \cdot I_{Dc2}}{\mu_n \cdot C_{ox} \cdot K \cdot (W/L)_{Mc3}}} + I_{Dc2} \cdot R_{Sc1}, \quad (1)$$

where K is the ratio between the aspect ratios of $M_{c1}$ and $M_{c3}$. Rearranging this expression, $$I_{Dc2} = \frac{2}{\mu_n \cdot C_{ox} \cdot (W/L)_{c3}} \cdot \frac{1}{R^2} \cdot \left(1 - \frac{1}{\sqrt{K}}\right)^2. \quad (2)$$

In the target circuit, K=1.6 and R=5 KΩ; therefore, $I_{Dc2}$=4 μA. As expected, the current is independent of the supply voltage (to a first order approximation). Transistor $M_{c5}$ mirrors this current to generate a stable 1 μA reference current, which is used in the bias circuit as shown in FIG. 2.

The aspect ratios of each of the transistors used in the OTA core (FIG. 1), the bias circuit (FIG. 2) and the reference current generator (FIG. 3) are listed in Tables 1, 2, and 3, respectively.

TABLE 1

Aspect ratios of the transistors used in the amplifier core

| Transistor | Width | Length | Ratio |
|---|---|---|---|
| $M_3, M_4, M_{29}$ | 5.40 μm | 360 nm | 15.0 |
| $M_5, M_6$ | 16.20 μm | 360 nm | 45.0 |
| $M_7, M_8$ | 2.52 μm | 360 nm | 7.0 |
| $M_9, M_{10}$ | 10.80 μm | 360 nm | 30.0 |
| $M_{13}, M_{14}$ | 21.60 μm | 360 nm | 60.0 |
| $M_{15}, M_{17}, M_{19}, M_{21}$ | 5.04 μm | 360 nm | 14.0 |
| $M_{16}, M_{18}, M_{20}, M_{22}$ | 1.80 μm | 360 nm | 5.0 |
| $M_{24}, M_{25}, M_{26}, M_{27}$ | 20.52 μm | 360 nm | 57.0 |
| $M_{23}, M_{28}$ | 11.16 μm | 360 nm | 31.0 |
| $M_{30}, M_3, M_{35}, M_{36}$ | 3.42 μm | 360 nm | 9.5 |
| $M_3, M_{34}$ | 1.98 μm | 360 nm | 5.5 |
| $M_{32}, M_{37}$ | 2.88 μm | 360 nm | 8.0 |
| $M_{38}$ | 18.36 μm | 360 nm | 51.0 |

TABLE 2

Aspect ratios of the transistors used in the bias circuit

| Transistor | Width | Length | Ratio |
|---|---|---|---|
| $M_{b1}, M_{b13}$ | 5.04 μm | 360 nm | 14.0 |
| $M_{b3}$ | 10.08 μm | 360 nm | 28.0 |
| $M_{b5}, M_{b22}$ | 2.88 μm | 360 nm | 8.0 |
| $M_{b6}$ | 18.00 μm | 360 nm | 50.0 |
| $M_{b7}$ | 0.40 μm | 360 nm | 1.1 |
| $M_{b8}$ | 0.47 μm | 360 nm | 1.3 |
| $M_{b9}$ | 1.73 μm | 360 nm | 4.8 |
| $M_{b10}$ | 15.12 μm | 360 nm | 42.0 |
| $M_{b12}$ | 1.80 μm | 360 nm | 5.0 |
| $M_{b15}$ | 5.40 μm | 360 nm | 15.0 |
| $M_{b17}$ | 9.43 μm | 360 nm | 26.2 |
| $M_{b18}$ | 0.27 μm | 360 nm | 0.7 |
| $M_{b21}$ | 7.02 μm | 360 nm | 19.5 |

TABLE 3

Aspect ratios of reference current transistors

| Transistor | Width | Length | Ratio |
|---|---|---|---|
| $M_{c1}$ | 5.52 μm | 1380 nm | 4.0 |
| $M_{c3}$ | 3.80 μm | 1520 nm | 2.5 |
| $M_{c2}, M_{c4}$ | 25.20 μm | 1400 nm | 18.0 |
| $M_{c5}$ | 6.16 μm | 1370 nm | 4.5 |

Figure 4:
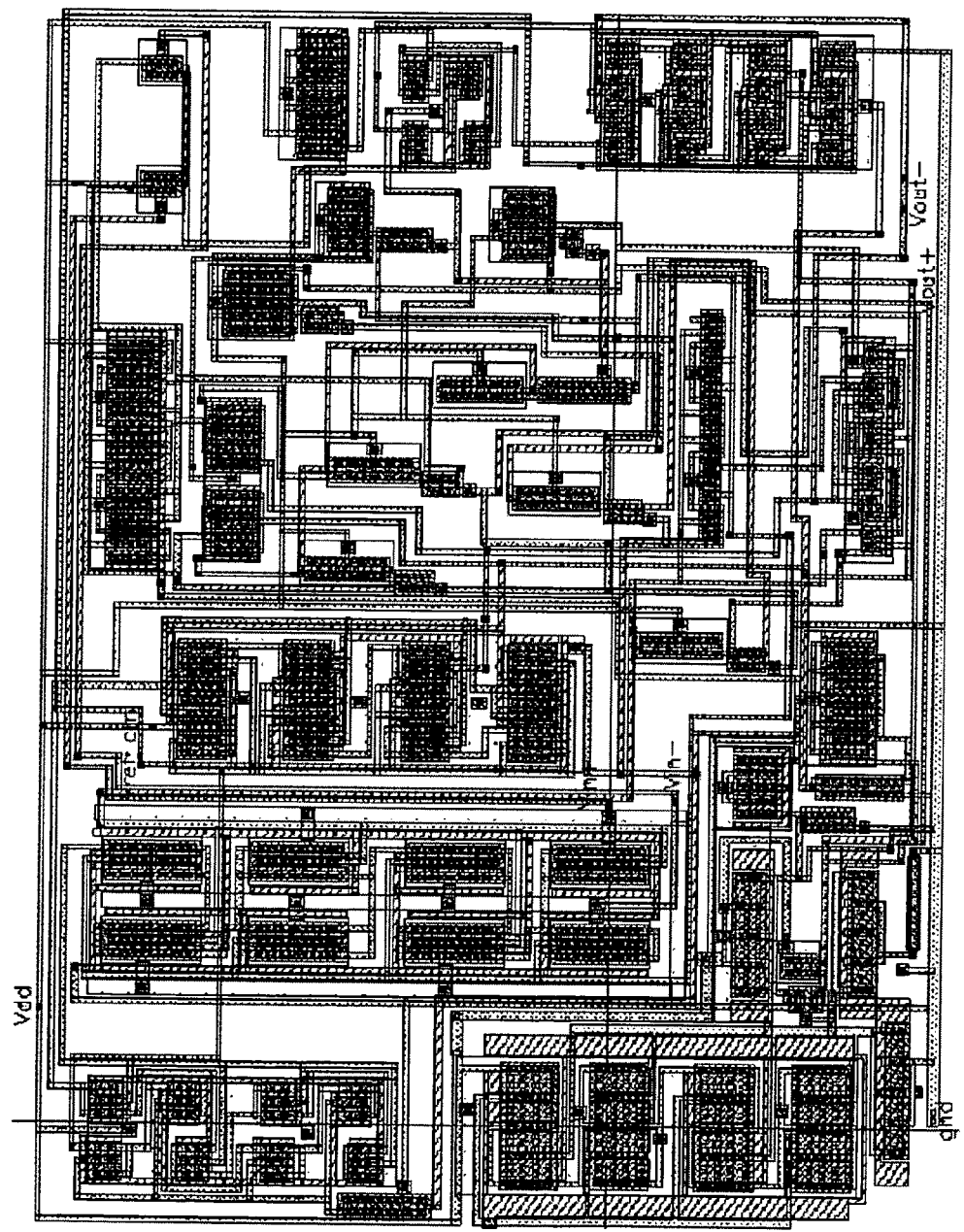
FIG. 4 is a diagram showing the physical layout of the OTA of FIG. 1.

The layout of the OTA including the bias circuit and current generator is illustrated in FIG. 4. A 0.18 μm CMOS twin-well TSMC process is used. Because both the PMOS and NMOS transistors are body biased, a twin-well technology is required in the bulk-driven technique. The double-well only marginally complication the manufacturing process. The use of a twin-well technology, however, is not a significant limitation for the bulk-driven method, since many advanced CMOS technologies use a two-well process, as reported in S. Yan and E. Sanchez-Sinencio, "Low Voltage Analog Circuit Design Techniques: A Tutorial," *Institute of Electronics, Information and Communication Engineers Transaction on Analog Integrated Circuits and Systems*, Vol. E00-A, pp. 1–17, February 2000. As shown in FIG. 4, interdigitization and common-centroid methods have been applied in the design of the OTA core so as to decrease mismatches among the transistors; that matter is described in R. J. Baker, H. W. Li, and D. E. Boyce, *CMOS Circuit Design, Layout, and Simulation*, New York: IEEE Press, 1998.

Figure 5:
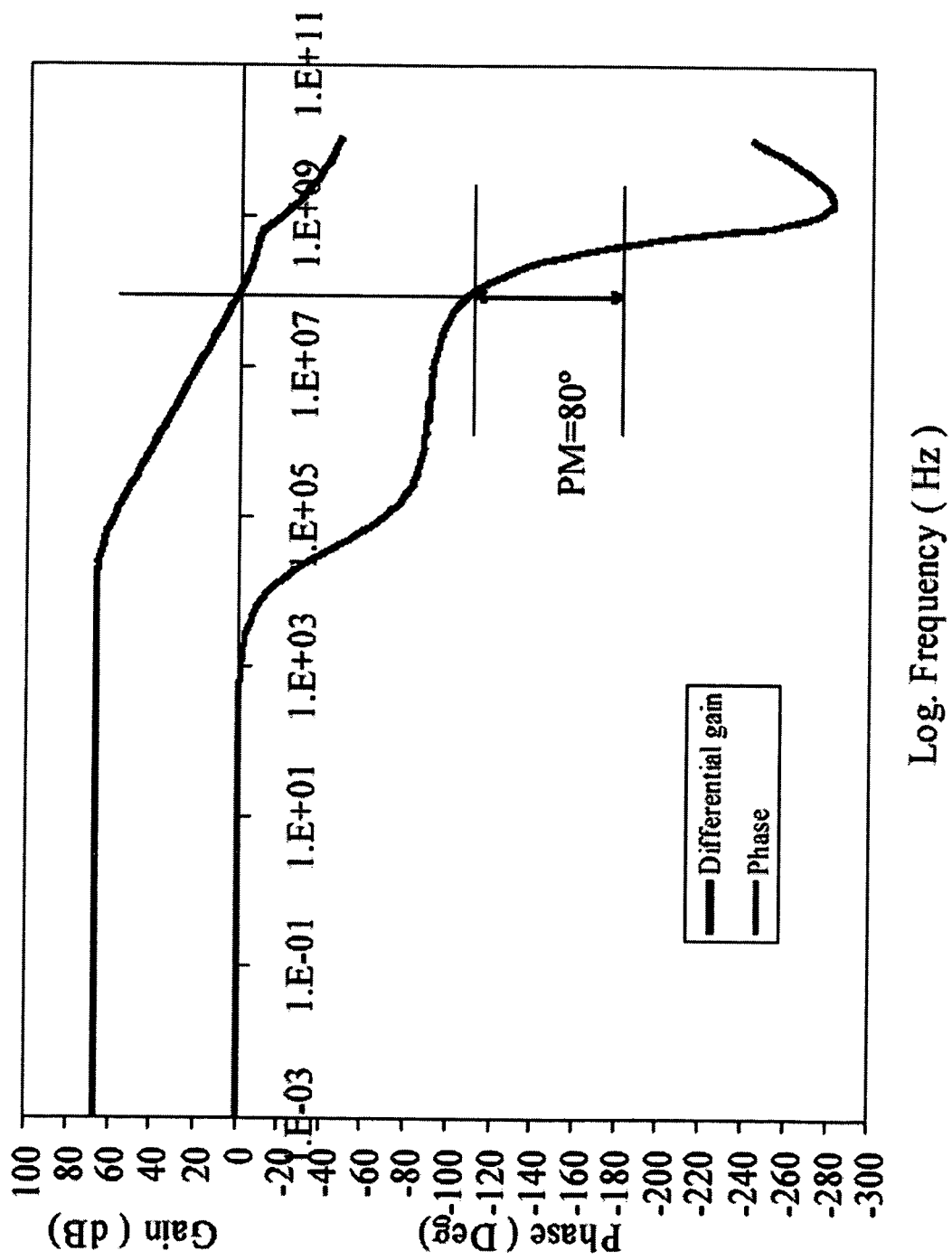
FIG. 5 is a plot of simulated open loop differential gain and phase as functions of frequency as plotted on a logarithmic scale.

The gain and phase responses of the OTA, which are obtained from post-layout simulations, are shown in FIG. 5. The OTA has an open-loop DC gain of 68 dB, a phase margin of 80°, and a unity-gain bandwidth of 93 MHz, under a no-load condition. For a capacitive load of 1 pF, the phase margin increases to 89°, while the unity-gain frequency reduces to 8.12 MHz. The OTA operates from a 0.8 volt single power supply and consumes 94 μW. The simulated ICMR and output swing are 800 mV and 700 mV, respectively.

While a preferred embodiment of the present invention has been set forth above in detail, those skilled in the art who have reviewed the present disclosure will readily appreciate that other embodiments can be realized within the scope of the present invention. For example, numerical values are illustrative rather than limiting, as are fabrication techniques. Therefore, the present invention should be construed as limited only by the appended claims.

We claim:

1. A rail-to-rail operational transconductance amplifier comprising:
   an input;
   an output; and
   an amplifier core connected to the input and the output;
   wherein the amplifier core comprises a bulk-driven operational transconductance amplifier element and an auxiliary gain-boosting amplifier connected to the bulk-driven operational transconductance amplifier element to boost a gain of the bulk-driven operational transconductance amplifier element, and wherein the bulk-driven operational transconductance amplifier element and the auxiliary gain-boosting amplifier are connected to provide local feedback action between the bulk-driven operational transconductance amplifier element and the auxiliary gain-boosting amplifier to reduce variations in bias current in the bulk-driven operational transconductance amplifier element.

2. The rail-to-rail operational transconductance amplifier of claim 1, wherein the bulk-driven transconductance amplifier element comprises a common-gate amplifier, the auxiliary gain-boosting amplifier comprises a common-source amplifier, an output of the common-source amplifier is connected to a gate of the common-gate amplifier, and a source of the common-gate amplifier is connected to an input of the common-source amplifier.

3. A rail-to-rail operational transconductance amplifier comprising:
   an input;
   an output; and
   an amplifier core connected to the input and the output;
   wherein the amplifier core comprises an input stage connected to the input, and wherein the input stage comprises a pair of bulk-driven PMOS transistors and a pair of bulk-driven NMOS transistors, the pair of bulk-driven PMOS transistors and the pair of bulk-driven NMOS transistors being connected to the input in parallel; and
   wherein the amplifier core further comprises an output branch connected to the output, and wherein the output branch comprises a pair of symmetric common gate amplifiers.

4. The rail-to-rail operational transconductance amplifier of claim 3, wherein the amplifier core further comprises a pair of gain-increasing cascode current loads, and wherein each of the symmetric common gate amplifiers is connected to one of the cascode current loads.

5. The rail-to-rail operational transconductance amplifier of claim 4, wherein the amplifier core further comprises two pairs of common source amplifiers whose outputs are connected to the common gate to define a source node which is fed back to inputs of the common source amplifiers to enhance further a DC output gain of the amplifier.

6. The rail-to-rail operational transconductance amplifier of claim 5, wherein the amplifier core further comprises a pair of common mode feedback circuits connected to the output branch to suppress variations in the output branch to increase an input common mode range of the amplifier.

7. The rail-to-rail operational transconductance amplifier of claim 6, further comprising a bias voltage generator circuit for generating a plurality of bias voltages and applying the plurality of bias voltages to the amplifier core such that transistors in the amplifier core operate in one of a saturation region and a linear region.

8. The rail-to-rail operational transconductance amplifier of claim 7, wherein the bias voltage generator circuit applies the plurality of bias voltage such that at least some transistors in the common mode feedback circuits operate in the linear region and such that remaining ones of the transistors receiving the bias voltages operate in the saturation region.

9. The rail-to-rail operational transconductance amplifier of claim 8, further comprising a reference current generator for generating a reference current and applying the reference current to the bias voltage generator circuit.

10. The rail-to-rail operational transconductance amplifier of claim 9, wherein the reference current generator comprises (i) two branches and (ii) two transistors having a common source and a common gate to generate the same reference current, to a first-order approximation, in both of said branches.

11. The rail-to-rail operational transconductance amplifier of claim 10, wherein the reference current generator further comprises a third transistor for mirroring the reference current.

12. The rail-to-rail operational transconductance amplifier of claim 11, wherein the reference current generator is configured to provide the reference current independently of a supply voltage to a first-order approximation.

13. The rail-to-rail operational transconductance amplifier of claim 9, comprising a single semiconductor chip in which the amplifier core, the bias voltage generator circuit and the reference current generator are implemented.

14. The rail-to-rail operational transconductance amplifier of claim 10, comprising a single semiconductor chip in which the amplifier core, the bias voltage generator circuit and the reference current generator are implemented.

15. The rail-to-rail operational transconductance amplifier of claim 10, comprising a single semiconductor chip in which the amplifier core, the bias voltage generator circuit and the reference current generator are implemented.

16. The rail-to-rail operational transconductance amplifier of claim 12, comprising a single semiconductor chip in which the amplifier core, the bias voltage generator circuit and the reference current generator are implemented.

* * * * *